(12) United States Patent
Nakagawa et al.

(10) Patent No.: US 11,641,004 B2
(45) Date of Patent: May 2, 2023

(54) LIGHT EMITTING DEVICE

(71) Applicant: NICHIA CORPORATION, Anan (JP)

(72) Inventors: Takefumi Nakagawa, Tokushima (JP); Yusuke Aoki, Anan (JP)

(73) Assignee: NICHIA CORPORATION, Anan (JP)

( * ) Notice: Subject to any disclaimer, the term of this patent is extended or adjusted under 35 U.S.C. 154(b) by 143 days.

(21) Appl. No.: 17/161,411

(22) Filed: Jan. 28, 2021

(65) Prior Publication Data

US 2021/0249562 A1 Aug. 12, 2021

(30) Foreign Application Priority Data

Feb. 7, 2020 (JP) .............................. JP2020-019410

(51) Int. Cl.
*H01L 33/20* (2010.01)
*H01L 33/50* (2010.01)
*H01L 33/38* (2010.01)
*H01L 33/16* (2010.01)

(52) U.S. Cl.
CPC .............. *H01L 33/20* (2013.01); *H01L 33/16* (2013.01); *H01L 33/38* (2013.01); *H01L 33/50* (2013.01)

(58) Field of Classification Search
CPC ......... H01L 33/20; H01L 33/38; H01L 33/50; H01L 33/16
See application file for complete search history.

(56) References Cited

U.S. PATENT DOCUMENTS

| | | | |
|---|---|---|---|
| 11,227,976 B2 * | 1/2022 | Niwa | H01L 33/20 |
| 11,387,385 B2 * | 7/2022 | Niwa | H01L 33/32 |
| 2013/0313592 A1 | 11/2013 | Sugizaki et al. | |
| 2017/0054065 A1 | 2/2017 | Tomizawa et al. | |
| 2018/0040767 A1 * | 2/2018 | Jang | H01L 33/10 |

FOREIGN PATENT DOCUMENTS

| | | |
|---|---|---|
| JP | 2013-247298 A | 12/2013 |
| JP | 2017-041612 A | 2/2017 |

* cited by examiner

*Primary Examiner* — Savitri Mulpuri
(74) *Attorney, Agent, or Firm* — Foley & Lardner LLP

(57) ABSTRACT

A light emitting device includes: a semiconductor structure including: a first semiconductor layer including: a first side parallel to an m-plane of the first semiconductor layer, and a second side meeting the first side, the second side being parallel to an a-plane of the first semiconductor layer, a light emitting layer disposed on a portion of the first semiconductor layer, and a second semiconductor layer disposed on the light emitting layer; a first conductive member disposed on the first semiconductor layer; a second conductive member disposed on the second semiconductor layer; a first terminal disposed on the first conductive member; a second terminal disposed on the second conductive member; and a covering member covering a lateral surface of the first conductive member, a lateral surface of the second conductive member, a lateral surface of the first terminal, and a lateral surface of the second terminal.

20 Claims, 7 Drawing Sheets

LIGHT EMITTING DEVICE

CROSS-REFERENCE TO RELATED APPLICATION

This application claims priority to Japanese Patent Application No. 2020-019410, filed on Feb. 7, 2020, the entire contents of which are hereby incorporated by reference.

BACKGROUND

The present invention relates to a light emitting device.

A light emitting device is disclosed in which a substrate used to grow a semiconductor layer is removed, and a phosphor layer is disposed on a surface of the semiconductor layer (for example, see JP 2017-41612 A). Improvement in the strength of such a light emitting device has been required.

SUMMARY

According to certain embodiments of the present invention, a light emitting device with high strength can be provided.

According to one embodiment of the present invention, a light emitting device includes a semiconductor structure, a first conductive member, a second conductive member, a first terminal, and a second terminal. The semiconductor structure includes a first semiconductor layer including a first side and a second side intersecting the first side, a light emitting layer disposed on a portion of the first semiconductor layer, and a second semiconductor layer disposed on the light emitting layer. The semiconductor structure has a rectangular shape in a top view. The first side is parallel to an m-plane of the first semiconductor layer. The second side is parallel to an a-plane of the first semiconductor layer. The first conductive member is disposed on the first semiconductor layer. The second conductive member is disposed on the second semiconductor layer. The first terminal is disposed on the first conductive member. The second terminal is disposed on the second conductive member. A covering member covers a lateral surface of the first conductive member, a lateral surface of the second conductive member, a lateral surface of the first terminal, and a lateral surface of the second terminal. The first conductive member includes a first end surface facing the second conductive member. The second conductive member includes a second end surface facing the first conductive member and being substantially parallel to the first end surface. The first end surface and the second end surface are substantially formed of surfaces inclined with respect to the m-plane. A portion of the first terminal and a portion of the second terminal are exposed from the covering member.

According to an embodiment of the present invention, a light emitting device with improved strength can be provided.

DETAILED DESCRIPTION

Figure 1:
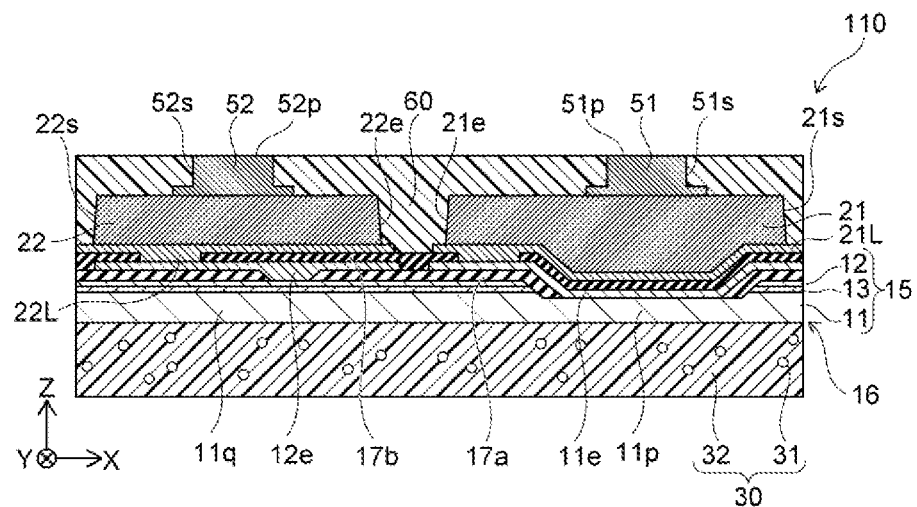
FIG. 1 is a schematic cross-sectional view illustrating an example of a light emitting device according to one embodiment of the present invention.

Certain embodiments of the present invention will be described below with reference to the drawings. The drawings are schematic, and the relationship between the thickness and the width of corresponding portions, the proportions of the sizes between portions, and the like are not necessarily to scale. The same portion may be illustrated with different dimensions or ratios among the drawings. In the specification and the drawings, elements similar to those described earlier with reference to the drawings are given the same reference numerals, and repeated detailed descriptions thereof will be omitted as appropriate.

Figure 2:
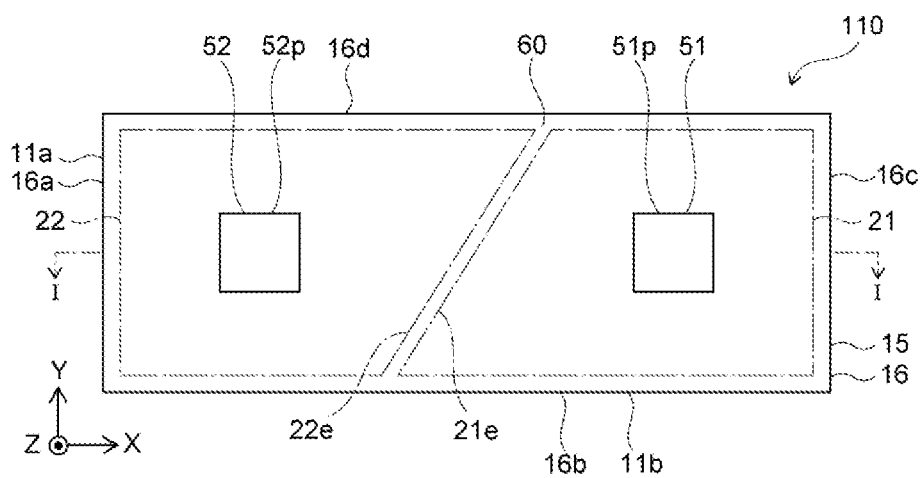
FIG. 2 is a schematic top view illustrating an example of the light emitting device according to one embodiment of the present invention.

As illustrated in FIGS. 1 and 2, a light emitting device 110 according to the present embodiment includes a semiconductor structure 16, a first conductive member 21, a second conductive member 22, a first terminal 51, a second terminal 52, and a covering member 60. FIG. 1 is a cross-sectional view taken along a line I-I of FIG. 2.

As illustrated in FIG. 1, the semiconductor structure 16 includes a first semiconductor layer 11, a second semiconductor layer 12, and a light emitting layer 13. The first semiconductor layer 11 is, for example, an n-type semiconductor layer. The second semiconductor layer 12 is, for example, a p-type semiconductor layer. The light emitting layer 13 is disposed between the first semiconductor layer 11 and the second semiconductor layer 12. For example, the light emitting layer 13 is disposed on a portion of the first semiconductor layer 11. The second semiconductor layer 12 is disposed on the light emitting layer 13.

In a layering direction of the first semiconductor layer 11 and the second semiconductor layer 12, for example, a direction from the first semiconductor layer 11 to the second semiconductor layer 12 is defined as a Z-axis direction. A direction perpendicular to the Z-axis direction is defined as an X-axis direction. A direction perpendicular to the Z-axis direction and the X-axis direction is defined as a Y-axis direction.

The first semiconductor layer 11 includes a first region 11p and a second region 11q, and a direction from the second region 11q to the first region 11p intersects the Z-axis direction. The light emitting layer 13 is disposed between the second region 11q and the second semiconductor layer 12 in the Z-axis direction.

As illustrated in FIG. 2, the semiconductor structure 16 has a rectangular shape in a top view. The first semiconductor layer 11 includes a first side 11a and a second side 11b. The second side 11b meets the first side 11a. For example, the first side 11a extends along the Y-axis direction. The second side 11b extends along the X-axis direction. The first semiconductor layer 11 has a rectangular shape in a top view. A length of the first side 11a is, for example, in a range of 100 μm to 1000 μm. A length of the second side 11b is, for example, in a range of 100 μm to 1000 μm.

The first side 11a is parallel to an m-plane of the first semiconductor layer 11. The second side 11b is parallel to an a-plane of the first semiconductor layer 11.

The first conductive member 21 is disposed above the first semiconductor layer 11. The second conductive member 22 is disposed above the second semiconductor layer 12. For example, the first region 11p of the first semiconductor layer 11 and the first conductive member 21 are layered along the Z-axis direction. The second semiconductor layer 12 and the second conductive member 22 are layered along the Z-axis direction.

The first terminal 51 is disposed on the first conductive member 21. The second terminal 52 is disposed on the second conductive member 22. The first conductive member 21 has a thickness greater than a thickness of the first terminal 51. The second conductive member 22 has a thickness greater than a thickness of the second terminal 52. The first terminal 51 and the second terminal 52 has a thickness, for example, in a range of 10 μm to 100 μm. The first conductive member 21 and the second conductive member 22 have a thickness, for example, in a range of 10 μm to 100 μm. The first terminal 51 has a planar area smaller than a planar area of the first conductive member 21. The second terminal 52 has a planar area smaller than a planar area of the second conductive member 22. The first conductive member 21 and the second conductive member 22 are formed of, for example, Au or Cu. The first terminal 51 and the second terminal 52 are formed of, for example, Au or Cu.

The first terminal 51 is electrically connected to the first semiconductor layer 11 through the first conductive member 21. The second terminal 52 is electrically connected to the second semiconductor layer 12 through the second conductive member 22. For example, the current supplied between the first terminal 51 and the second terminal 52 causes the light emitting layer 13 to emit light. A light emission peak wavelength of the light emitting layer 13 is, for example in a range of 430 nm to 540 nm. The light emitting device 110 having the semiconductor structure 16 can be, for example, an LED.

As illustrated in FIG. 1, the first semiconductor layer 11, the second semiconductor layer 12, and the light emitting layer 13 are included in a semiconductor layered body 15. The semiconductor structure 16 includes the semiconductor layered body 15. The semiconductor layered body 15 is formed of, for example, nitride semiconductor layers containing gallium. Examples of the nitride semiconductor include semiconductors represented by $In_xAl_yGa_{1-x-y}N$ ($0 \leq x \leq 1$, $0 \leq y \leq 1$, $x+y \leq 1$), in which composition ratios x and y respectively satisfy the ranges indicated above. The semiconductor structure 16 can further include a buffer layer. The semiconductor layered body 15 has a thickness, for example, in a range of 5 μm to 15 μm. As will be described below, semiconductor layers of the semiconductor structure 16 are grown on a substrate. Examples of the substrate include a sapphire substrate having a c-plane (0001) that serves as a growth surface for a semiconductor layer. Semiconductor layers of the semiconductor structure 16 are layered along a c-axis direction of the substrate. For example, an upper surface of the semiconductor structure 16 is the c-plane (0001) of a semiconductor layer. For example, the upper surface of the first semiconductor layer 11 and the upper surface of the second semiconductor layer 12 are both the c-plane (0001) of a semiconductor layer.

As illustrated in FIG. 1, the covering member 60 covers a lateral surface 21s of the first conductive member 21, a lateral surface 22s of the second conductive member 22, a lateral surface 51s of the first terminal 51, and a lateral surface 52s of the second terminal 52. The lateral surface 21s of the first conductive member 21, the lateral surface 22s of the second conductive member 22, the lateral surface 51s of the first terminal 51, and the lateral surface 52s of the second terminal 52 are inclined with respect to an X-Y plane. The lateral surface 21s of the first conductive member 21, the lateral surface 22s of the second conductive member 22, the lateral surface 51s of the first terminal 51, and the lateral surface 52s of the second terminal 52 are inclined with respect to a plane perpendicular to a layering direction of the semiconductor structure 16. The semiconductor structure 16 is layered along, for example, a direction from the first semiconductor layer 11 to the second semiconductor layer 12.

As illustrated in FIG. 1, a portion 51p of the first terminal 51 and a portion 52p of the second terminal 52 are exposed from the covering member 60. The portion 51p of the first terminal 51 is a portion of a surface of the first terminal 51 exposed from the covering member 60. The portion 52p of the second terminal 52 is a portion of a surface of the second terminal 52 exposed from the covering member 60.

As illustrated in FIGS. 1 and 2, the first conductive member 21 includes a first end surface 21e. The second conductive member 22 includes a second end surface 22e. The first end surface 21e faces the second end surface 22e of the second conductive member 22. The second end surface 22e and the first end surface 21e are substantially parallel to each other along a direction inclined with respect to the X-axis direction and the Y-axis direction.

The first end surface 21e and the second end surface 22e are substantially formed of surfaces inclined with respect to the m-plane of the first semiconductor layer 11. As described above, the upper surface of the first semiconductor layer 11 is the c-plane, and the m-plane of the first semiconductor layer 11 is a cleavage plane of the first semiconductor layer 11. As used herein, the expression "the first end surface 21e and the second end surface 22e are substantially formed of surfaces inclined with respect to the m-plane of the first semiconductor layer 11" means that 95% or greater of the first end surface 21e and the second end surface 22e is inclined with respect to the m-plane of the first semiconductor layer 11. For example, a configuration in which the first end surface 21e and the second end surface 22e are formed of surfaces that are substantially parallel to each other, in which approximately 3% of the first end surface 21e and the second end surface 22e are along the m-plane of the first semiconductor layer 11 is included in the configuration in which the first end surface 21e and the second end surface 22e are substantially formed of surfaces each inclined with respect to the m-plane of the first semiconductor layer 11. As described above, the first side 11a is parallel to the m-plane of the first semiconductor layer 11. For example, the m-plane of the first semiconductor layer 11 is along a Y-Z plane. For example, the first end surface 21e is inclined with respect to the Y-Z plane. For example, the second end surface 22e is inclined with respect to the Y-Z plane.

For example, when the light emitting device 110 is mounted on a mounting component or the like, stress may be experienced between the first conductive member 21 and the second conductive member 22. This stress is also experienced on the semiconductor structure 16. For example, when a stress is experienced in a direction perpendicular or parallel to the m-plane of the first semiconductor layer 11, damage (such as cracking) is likely to occur in the semiconductor structure 16 due to the stress. In the present embodiment, the first end surface 21e and the second end surface 22e are inclined with respect to the m-plane of the first semiconductor layer 11. With this structure, the damage in the semiconductor structure 16 can be reduced even when experiencing stress. According to the present embodiment, the strength of the light emitting device 110 can be improved, which allows for obtaining a light emitting device with high strength.

In the embodiment, an angle between a portion of the first end surface 21e and the m-plane of the first semiconductor layer 11 is in a range of 20 degrees to 40 degrees. This allows the first end surface 21e to be more inclined with respect to the m-plane of the first semiconductor layer 11, so that damage (cracking) in the semiconductor structure 16 can be more effectively reduced.

As illustrated in FIG. 1, the light emitting device 110 further includes a wavelength conversion layer 30. The wavelength conversion layer 30 includes, for example, a plurality of wavelength conversion particles 31 and a light-transmissive member 32. The plurality of wavelength conversion particles 31 are phosphor particles or the like, and are dispersed in the light-transmissive member 32. The light-transmissive member 32 includes, for example, at least one selected from the group consisting of silicone resin, acrylic resin, and epoxy resin. The light-transmissive member 32 can include, for example, a light diffusing member. The light diffusing member is made of, for example, at least one selected from the group consisting of titanium oxide and aluminum oxide. The wavelength conversion layer 30 is configured to convert a wavelength of light emitted from the light emitting layer 13. For example, in a case in which light emitted from the light emitting layer 13 is blue, a portion of the light passing through the wavelength conversion layer 30 is converted into yellow. Light emitted from the light emitting layer 13 and light passing through the wavelength conversion layer 30 are extracted, resulting in extraction of, for example, white light from the light emitting device 110.

In the present embodiment, for example, the wavelength conversion layer 30 is in contact with the first semiconductor layer 11. For example, the wavelength conversion layer 30 is in contact with the semiconductor structure 16. As will be described below, the semiconductor layer of the semiconductor structure 16 is grown on the substrate. After the growth of the semiconductor layer, the substrate is removed, and the wavelength conversion layer 30 is disposed on the semiconductor structure 16. With removal of the substrate, a thickness of the semiconductor structure 16 is reduced. With reduction in thickness of the semiconductor structure 16, the semiconductor structure 16 may be more susceptible to the stress caused in the mounting of the light emitting device 110 described above. Even in such a case, with the first end surface 21e and the second end surface 22e inclined with respect to the m-plane of the first semiconductor layer 11, damage (such as cracking) can be more effectively suppressed. The wavelength conversion layer 30 has a thickness, for example, in a range of 10 µm to 100 µm, and preferably in a range of 20 µm to 100 µm.

In the present embodiment, as illustrated in FIGS. 1 and 2, a shortest distance between the portion 51p of the first terminal 51 and the portion 52p of the second terminal 52 is greater than a shortest distance between the first end surface 21e and the second end surface 22e. This allows for preventing short-circuit between the first terminal 51 and the second terminal 52 that may be caused by a joining member or the like during mounting, with the first conductive member 21 and the second conductive member 22 allowing for improving the strength of the light emitting device 110. The shortest distance between the portion 51p of the first terminal 51 and the portion 52p of the second terminal 52 is in a range of 100 µm to 500 µm, for example. The shortest distance between the first end surface 21e and the second end surface 22e is, for example, in a range of 10 µm to 200 µm, and preferably in a range of 20 µm to 100 µm. For example, a shortest distance between a first side portion 16a and the portion 52p of the second terminal 52 is substantially equal to a shortest distance between a third side portion 16c and the portion 51p of the first terminal 51.

As illustrated in FIG. 2, for example, the first side 11a can be shorter than the second side 11b. The portion 51p of the first terminal 51 and the portion 52p of the second terminal 52 are arranged along the second side 11b.

As illustrated in FIG. 2, for example, the semiconductor structure 16 includes a first side portion 16a, a second side portion 16b, the third side portion 16c, and a fourth side portion 16d. A direction from the first side portion 16a to the third side portion 16c is along, for example, the X-axis direction.

A direction from the second side portion 16b to the fourth side portion 16d is along the Y-axis direction. A direction in which the third side portion 16c extends is along a direction in which the first side portion 16a extends. A direction in which the fourth side portion 16d extends is along a direction in which the second side portion 16b extends.

The first side portion 16a is connected to the second side portion 16b and the fourth side portion 16d. A connecting portion between the first side portion 16a and the second side portion 16b can include a curved portion. A connecting portion between the first side portion 16a and the fourth side portion 16d can include a curved portion. The third side portion 16c is connected to the second side portion 16b and the fourth side portion 16d. A connecting portion between the third side portion 16c and the second side portion 16b can include a curved portion. A connecting portion between the third side portion 16c and the fourth side portion 16d can include a curved portion.

The first side portion 16a and the third side portion 16c are along the first side 11a. The second side portion 16b and the fourth side portion 16d are along the second side 11b.

For example, the first conductive member 21 is disposed between at least a portion of the first region 11p of the first semiconductor layer 11 and at least a portion of the first terminal 51. The second conductive member 22 is disposed between at least a portion of the second semiconductor layer 12 and at least a portion of the second terminal 52.

In this example, as illustrated in FIG. 1, a first metal layer 11e is disposed between the first region 11p of the first semiconductor layer 11 and the first conductive member 21. The first metal layer 11e is connected to the first region 11p. A first insulating film 17a is partially provided between the first metal layer 11e and a first conductive film 21L, and the first metal layer 11e and the first conductive film 21L are partially connected. The first region 11p is electrically connected to the first conductive member 21 through the first metal layer 11e and the first conductive film 21L. A second metal layer 12e is disposed between the second semiconductor layer 12 and the second conductive member 22. The second metal layer 12e is connected to the second semiconductor layer 12. A second insulating film 17b is partially provided between the second metal layer 12e and a second conductive film 22L, and the second metal layer 12e and the second conductive film 22L are partially connected. The second semiconductor layer 12 is electrically connected to the second conductive member 22 through the second metal layer 12e and the second conductive film 22L.

An example of a method of manufacturing the light emitting device 110 will be described below. FIGS. 3 to 10 are schematic cross-sectional views illustrating the method of manufacturing the light emitting device according to the present embodiment.

Figure 3:
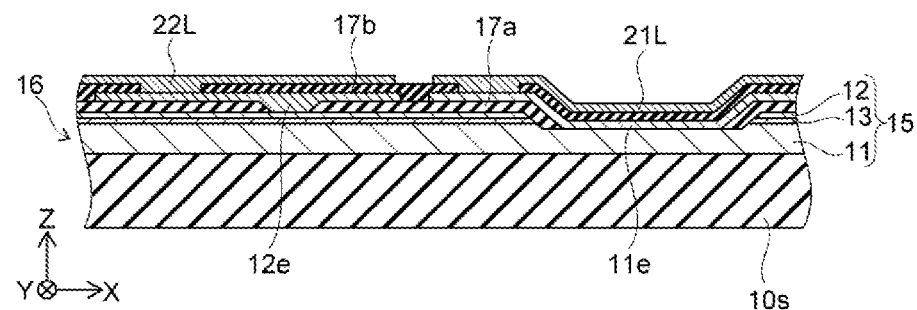
FIG. 3 is a schematic cross-sectional view illustrating an example of a method of manufacturing a light emitting device according to one embodiment of the present invention.

As illustrated in FIG. 3, the first semiconductor layer 11, the light emitting layer 13, and the second semiconductor layer 12 are sequentially formed on a substrate 10s. A plurality of portions of the second semiconductor layer 12 and a plurality of corresponding portions of the light emitting layer 13 are removed to expose a plurality of portions of the first semiconductor layer 11. Accordingly, the semiconductor structure 16 is formed. The first insulating film 17a having a plurality of holes for exposing the plurality of portions of the first semiconductor layer 11 and a plurality of holes for exposing a plurality of portions of the second semiconductor layer 12 is formed on the semiconductor structure 16. The first insulating film 17a covers lateral surfaces of the exposed portions of the first semiconductor layer 11, lateral surfaces of the exposed portions of the light emitting layer 13, and lateral surfaces and an upper surface of the second semiconductor layer 12. The first metal layer 11e electrically connected to the exposed portions of the first semiconductor layer 11 is formed. A portion of the first metal layer 11e is provided on the first insulating film 17a. A portion of the first insulating film 17a is provided between the second semiconductor layer 12 and the first metal layer 11e. The second metal layer 12e electrically connected to a portion of the second semiconductor layer 12 is formed. A portion of the second metal layer 12e is provided on the first insulating film 17a. A portion of the first insulating film 17a is provided between the second semiconductor layer 12 and the second metal layer 12e. The second insulating film 17b having holes for exposing portions of the first metal layer 11e and holes for exposing portions of the second metal layer 12e is formed on the first metal layer 11e and the second metal layer 12e. The first conductive film 21L is formed to be electrically connected to a portion of the first metal layer 11e. The second conductive film 22L is formed to be electrically connected to the second metal layer 12e.

Figure 4:
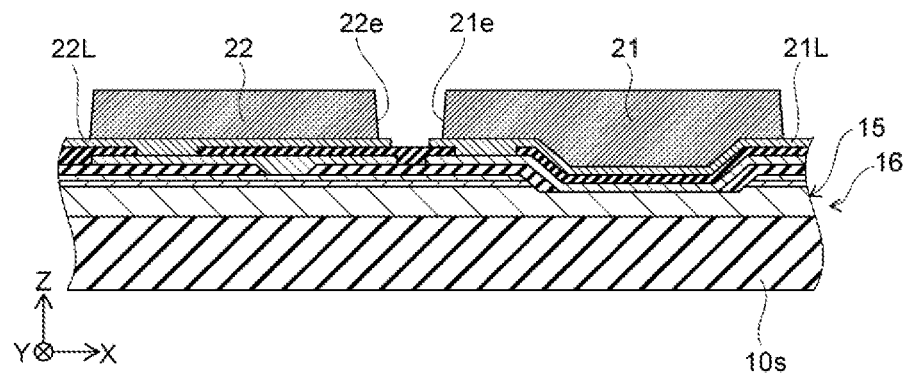
FIG. 4 is a schematic cross-sectional view illustrating an example of the method of manufacturing the light emitting device according to one embodiment of the present invention.

As illustrated in FIG. 4, the first conductive member 21 is formed on the first conductive film 21L, and the second conductive member 22 is formed on the second conductive film 22L. For example, a resist having holes on the first conductive film 21L and the second conductive film 22L, is disposed, and then a conductive material is disposed in the holes of the resist. Then, the resist is removed to obtain the first conductive member 21 having the first end surface 21e and the second conductive member 22 having the second end surface 22e. The first end surface 21e of the first conductive member 21 faces the second end surface 22e of the second conductive member 22. The first end surface 21e and the second end surface 22e are inclined with respect to the m-plane of the first semiconductor layer 11. The conductive material is disposed using, for example, a plating technique, a sputtering technique, or the like.

Figure 5:
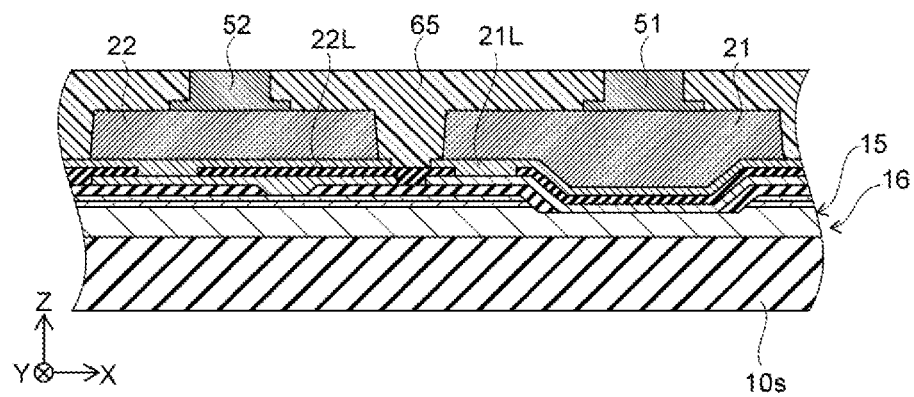
FIG. 5 is a schematic cross-sectional view illustrating an example of the method of manufacturing the light emitting device according to one embodiment of the present invention.

For example, a resist 65 is disposed to cover the first end surface 21e of the first conductive member 21 and the second end surface 22e of the second conductive member 22 and to have holes on the first conductive member 21 and the second conductive member 22. Disposing the conductive material in the holes of the resist 65 allows for obtaining the first terminal 51 connected to the first conductive member 21 and the second terminal 52 connected to the second conductive member 22 as illustrated in FIG. 5. The conductive material is disposed using, for example, a plating technique, a sputtering technique, or the like.

Figure 6:
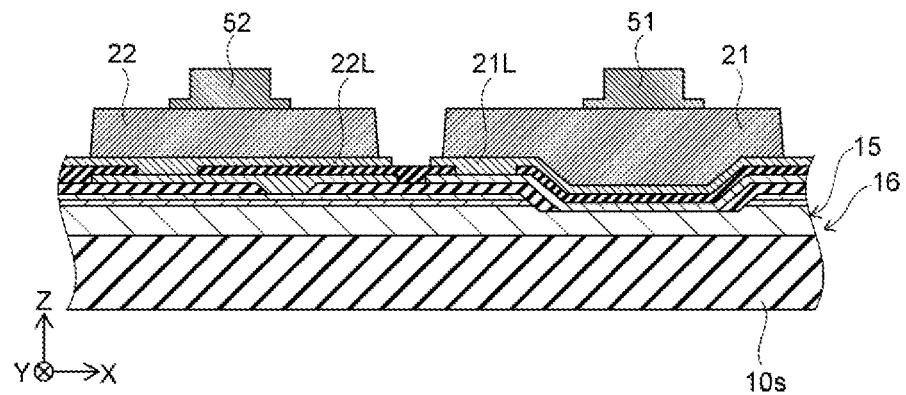
FIG. 6 is a schematic cross-sectional view illustrating an example of the method of manufacturing the light emitting device according to one embodiment of the present invention.

As illustrated in FIG. 6, the resist 65 is removed. As a result of the removal of the resist 65, a portion of a surface of each of the first conductive member 21 and the second conductive member 22 and a portion of a surface of each of the first terminal 51 and the second terminal 52 are exposed. Accordingly, a first layered structure is formed in which the first terminal 51 is provided on the first conductive member 21, and a second layered structure is formed in which the second terminal 52 is provided on the second conductive member 22.

Figure 7:
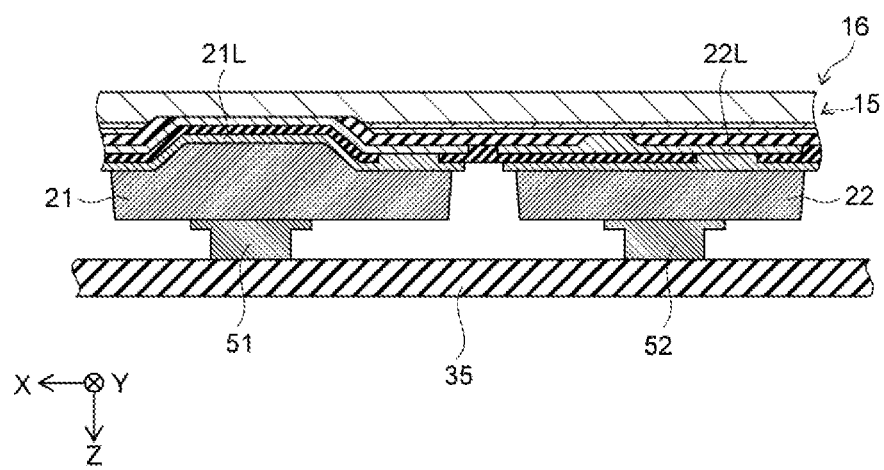
FIG. 7 is a schematic cross-sectional view illustrating an example of the method of manufacturing the light emitting device according to one embodiment of the present invention.

As illustrated in FIG. 7, the first terminal 51 and the second terminal 52 is placed to face the support substrate 35, and the semiconductor structure 16 is fixed to the support substrate 35. The substrate 10s is removed in a state in which the semiconductor structure 16 is fixed to the support substrate 35, so that a surface of the semiconductor structure 16 is exposed. Separation is performed along the m-plane and the a-plane of the first semiconductor layer 11 included in the semiconductor structure 16 to form a plurality of structures each provided with an individual semiconductor structure 16. The support substrate 35 is then removed.

Figure 8:
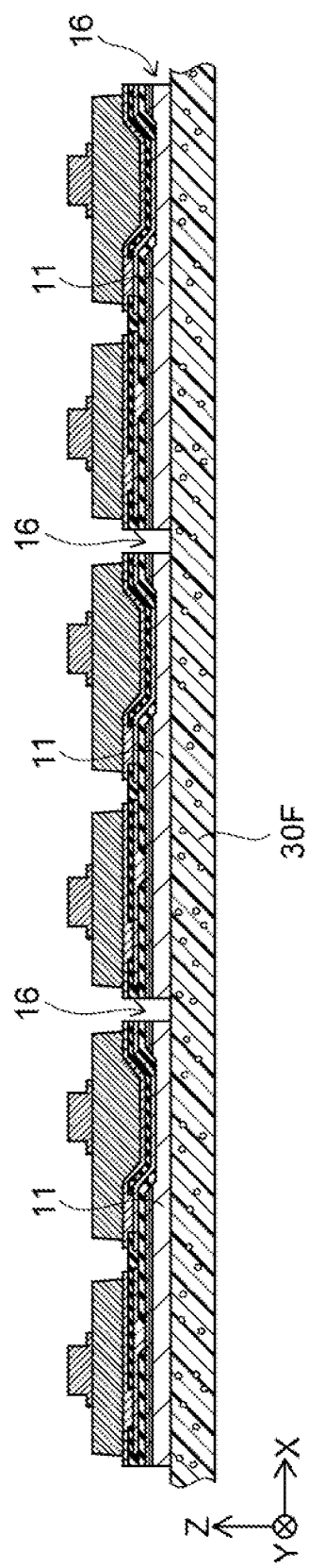
FIG. 8 is a schematic cross-sectional view illustrating an example of the method of manufacturing the light emitting device according to one embodiment of the present invention.

As illustrated in FIG. 8, the plurality of structures, each including the individual semiconductor structure 16, are secured to a wavelength conversion sheet 30F. For example, the wavelength conversion sheet 30F is in contact with the first semiconductor layer 11. Examples of the wavelength conversion sheet 30F include a phosphor sheet.

Figure 9:
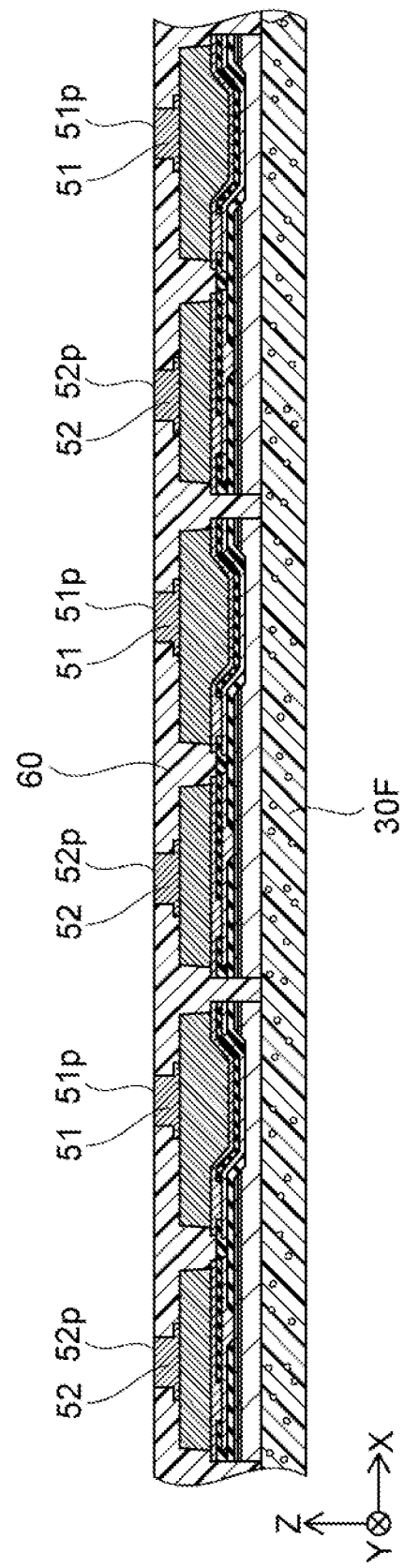
FIG. 9 is a schematic cross-sectional view illustrating an example of the method of manufacturing the light emitting device according to one embodiment of the present invention.

As illustrated in FIG. 9, the covering member 60 is disposed with exposing the portion 51p of the first terminal 51 and the portion 52p of the second terminal 52. For example, a material of the covering member 60 is disposed to cover the surfaces of the first conductive member 21, the second conductive member 22, the first terminal 51 and the second terminal 52. A portion of the material of the covering member 60 is removed to expose the portion 51p of the first terminal 51 and the portion 52p of the second terminal 52, thus the covering member 60 is obtained. The material of the covering member can be disposed by, for example, compression molding.

Figure 10:
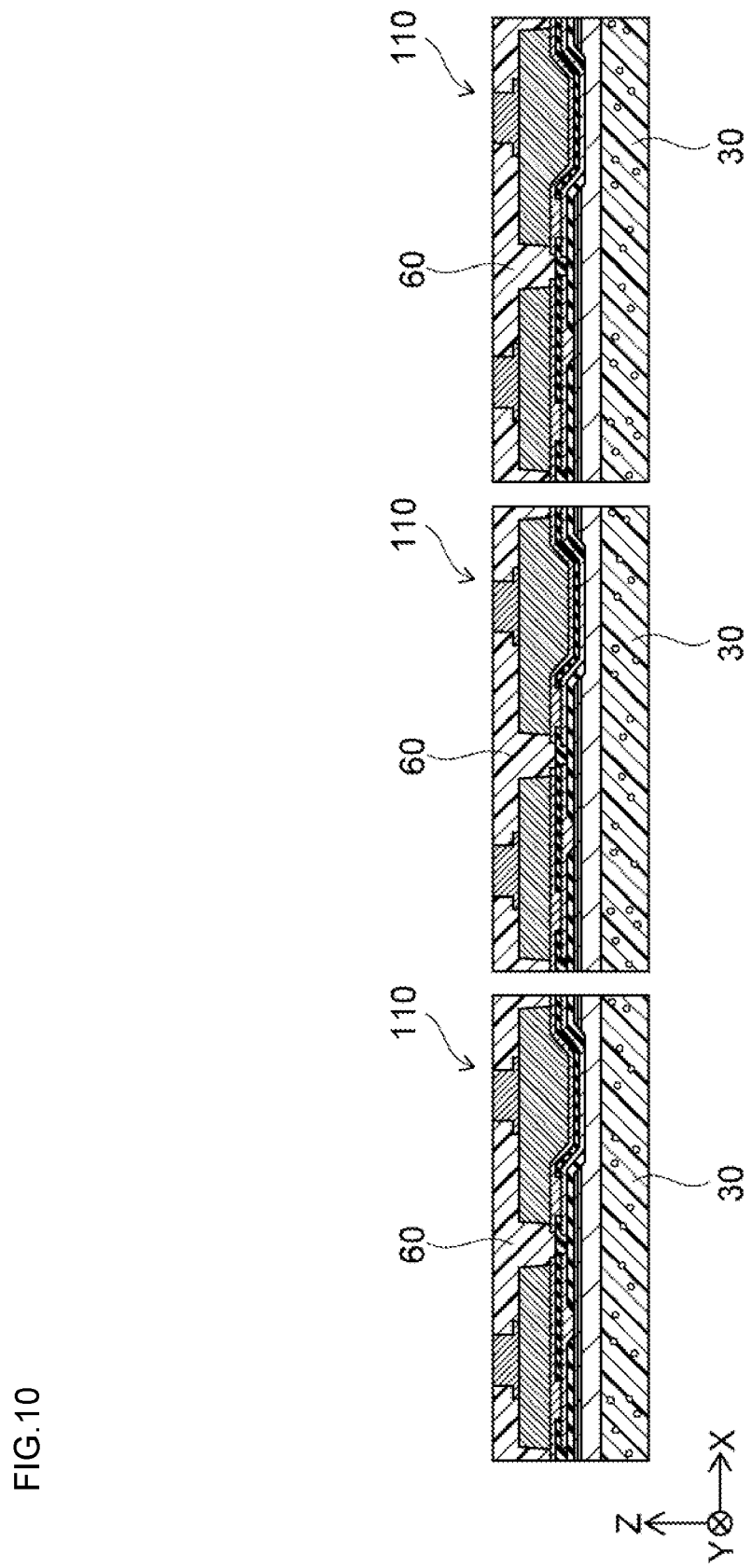
FIG. 10 is a schematic cross-sectional view illustrating an example of the method of manufacturing the light emitting device according to one embodiment of the present invention.

As illustrated in FIG. 10, the wavelength conversion sheet 30F and the covering member 60 are cut to obtain a plurality of light emitting devices 110, each provided with the wavelength conversion layer 30.

Figure 11:
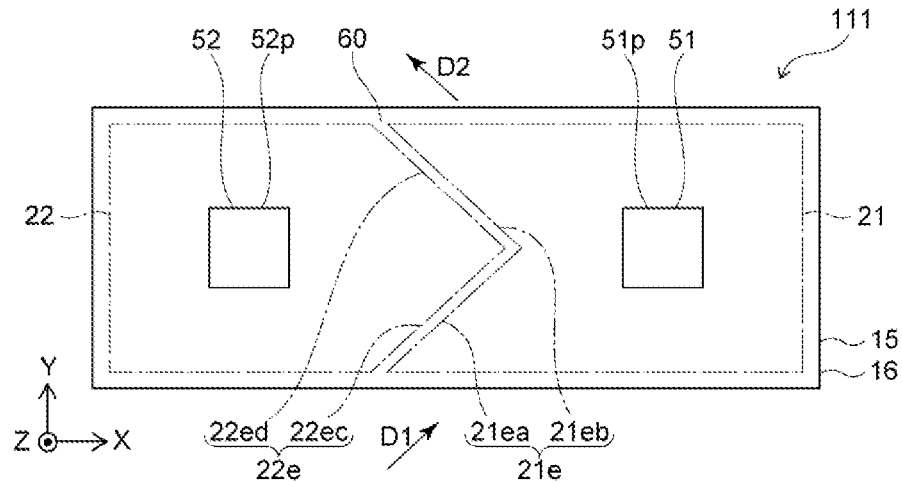
FIG. 11 is a schematic top view illustrating an example of a light emitting device according to the embodiment of the present invention.
Figure 12:
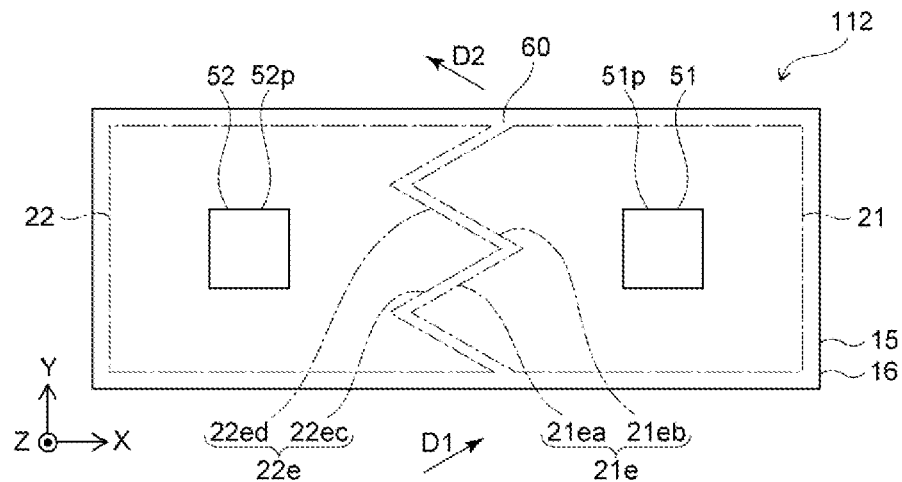
FIG. 12 is a schematic top view illustrating an example of a light emitting device according to the embodiment of the present invention.
Figure 13:
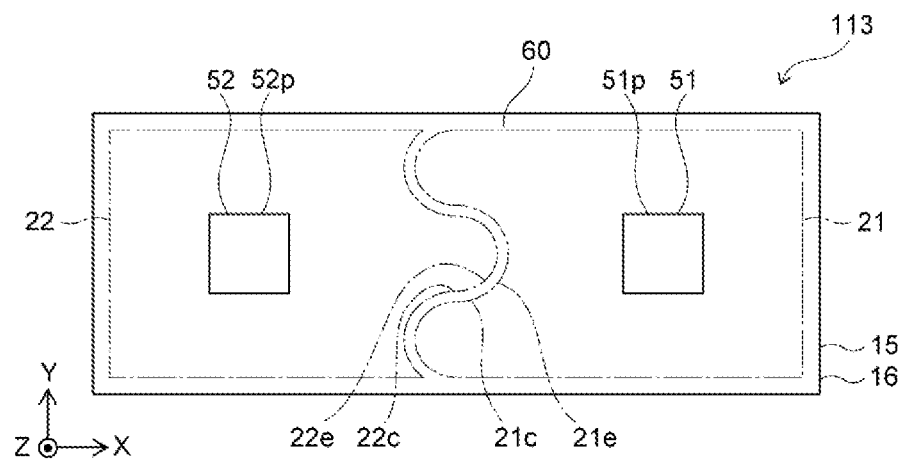
FIG. 13 is a schematic top view illustrating an example of a light emitting device according to the embodiment of the present invention.

Some examples of the light emitting device according to the present embodiment will be described below. FIGS. 11 to 13 are schematic top views illustrating light emitting devices according to the present embodiment. As illustrated in FIGS. 11 to 13, each of light emitting devices 111 to 113 according to the present embodiment also includes the semiconductor structure 16, the first conductive member 21, the second conductive member 22, the first terminal 51, the second terminal 52, and the covering member 60. In the light emitting devices 111 to 113, shapes of the first conductive member 21 and the second conductive member 22 are different from the shapes of the first conductive member 21 and the second conductive member 22 in the light emitting device 110. The shapes of the first conductive member 21 and the second conductive member 22 in the light emitting devices 111 to 113 will be described below.

As illustrated in FIG. 11, in the light emitting device 111, the first end surface 21e of the first conductive member 21 includes a first surface 21ea and a second surface 21eb. The first surface 21ea and the second surface 21eb are continuous. The first surface 21ea and the second surface 21eb are substantially formed by surfaces that are inclined with respect to the m-plane of the first semiconductor layer 11. The first surface 21ea is oriented in a first direction D1, the first direction D1 being inclined at an angle with respect to the m-plane of the first semiconductor layer 11. The second surface 21eb is oriented in a second direction D2, the second direction D2 being inclined at an angle with respect to the m-plane of the first semiconductor layer 11 and at an angle with respect to the first direction D1.

The second end surface 22e of the second conductive member 22 includes a third surface 22ec and a fourth surface 22ed. The third surface 22ec and the fourth surface 22ed are continuous. The third surface 22ec and the fourth surface 22ed are substantially formed by surfaces that are inclined with respect to the m-plane of the first semiconductor layer 11. The third surface 22ec is oriented in the first direction D1. The fourth surface 22ed is oriented in the second direction D2.

The first surface 21ea, the second surface 21eb, the third surface 22ec, and the fourth surface 22ed are inclined with respect to the m-plane of the first semiconductor layer 11. The first surface 21ea faces the third surface 22ec. The second surface 21eb faces the fourth surface 22ed. With the first end surface 21e and the second end surface 22e each having a surface oriented in the first direction D1 and a surface oriented in the second direction D2, the light emitting device 111 can have an increased strength compared with, for example, a light emitting device in which each of the first end surface 21e and the second end surface 22e has only a surface along the first direction D1.

As illustrated in FIG. 12, in the light emitting device 112, the first end surface 21e includes a plurality of first surfaces 21ea and a plurality of second surfaces 21eb. The second end surface 22e includes a plurality of third surfaces 22ec and a plurality of fourth surfaces 22ed. Similar to the light emitting device 111 described above, the first surfaces 21ea, the second surfaces 21eb, the third surfaces 22ec, and the fourth surfaces 22ed are inclined with respect to the m-plane of the first semiconductor layer 11. With the first end surface 21e and the second end surface 22e each having a plurality of surfaces oriented in the first direction D1 and a plurality of surfaces oriented in the second direction D2, the light emitting device 112 can have an increased strength compared with, for example, a light emitting device in which each of the first end surface 21e and the second end surface 22e has only a surface facing the first direction D1.

As illustrated in FIG. 13, in the light emitting device 113, the first end surface 21e has a first curved portion 21c. The second end surface 22e has a second curved portion 22c. The second curved portion 22c is substantially parallel to the first curved portion 21c. In the light emitting device 113, the stress experienced during mounting is less likely to be exerted along the straight line and is likely to be dispersed, compared with the light emitting device in which each of the first end surface 21e and the second end surface 22e has only a surface along the first direction D1. Accordingly, the light emitting device 113 can have a further increased strength.

Also in the light emitting devices 111 to 113, damage in the semiconductor structure 16 due to stress experienced during mounting can be reduced. According to the examples of the present embodiments, the strength of the light emitting devices 111 to 113 can be improved, and a light emitting device having increased strength can be provided.

Certain embodiments of the present invention have been described with reference to specific examples, as described above. However, the present invention is not limited to these specific examples. For example, specific configurations of the semiconductor layered structure, the conductive members, the terminals, and the like in the light emitting device are within the scope of the present invention as long as a person skilled in the art can similarly implement the present invention with appropriate selection of such specific configurations within a known range and can obtain a similar effect.

Furthermore, a configuration in which any two or more elements of each of the specific examples are combined to a technically possible extent is also within the scope of the present invention as long as it is within the spirit of the present invention.

What is claimed is:

1. A light emitting device, comprising:
   a semiconductor structure having a rectangular shape in a top view, the semiconductor structure comprising:
      a first semiconductor layer including:
         a first side parallel to an m-plane of the first semiconductor layer, and
         a second side meeting the first side, the second side being parallel to an a-plane of the first semiconductor layer,
      a light emitting layer disposed on a portion of the first semiconductor layer, and
      a second semiconductor layer disposed on the light emitting layer;
   a first conductive member disposed on the first semiconductor layer;
   a second conductive member disposed on the second semiconductor layer;
   a first terminal disposed on the first conductive member;
   a second terminal disposed on the second conductive member; and
   a covering member covering a lateral surface of the first conductive member, a lateral surface of the second conductive member, a lateral surface of the first terminal, and a lateral surface of the second terminal, wherein:

the first conductive member includes a first end surface facing the second conductive member, wherein the first end surface includes:
a first surface oriented in a first direction that is inclined at an angle with respect to the m-plane, and
a second surface oriented in a second direction that is inclined at an angle with respect to the m-plane and at an angle with respect to the first direction,
the second conductive member includes a second end surface facing the first conductive member and being substantially parallel to the first end surface, wherein the second end surface includes:
a third surface oriented in the first direction, and
a fourth surface oriented in the second direction, and
a portion of the first terminal and a portion of the second terminal are exposed from the covering member.

2. The light emitting device according to claim 1, wherein:
an angle between a portion of the first end surface and the m-plane is in a range of 20 degrees to 40 degrees.

3. The light emitting device according to claim 1, wherein:
the first end surface includes a curved portion.

4. The light emitting device according to claim 2, wherein:
the first end surface includes a curved portion.

5. The light emitting device according to claim 1, wherein:
the first side is shorter than the second side, and
the exposed portion of the first terminal and the exposed portion of the second terminal are arranged along the second side.

6. The light emitting device according to claim 2, wherein:
the first side is shorter than the second side, and
the exposed portion of the first terminal and the exposed portion of the second terminal are arranged along the second side.

7. The light emitting device according to claim 1, wherein:
a shortest distance between the exposed portion of the first terminal and the exposed portion of the second terminal is greater than a shortest distance between the first end surface and the second end surface.

8. The light emitting device according to claim 2, wherein:
a shortest distance between the exposed portion of the first terminal and the exposed portion of the second terminal is greater than a shortest distance between the first end surface and the second end surface.

9. The light emitting device according to claim 1, further comprising:
a wavelength conversion layer, wherein:
the wavelength conversion layer is in contact with the first semiconductor layer.

10. The light emitting device according to claim 2, further comprising:
a wavelength conversion layer, wherein:
the wavelength conversion layer is in contact with the first semiconductor layer.

11. The light emitting device according to claim 3, further comprising:
a wavelength conversion layer, wherein:
the wavelength conversion layer is in contact with the first semiconductor layer.

12. A light emitting device comprising:
a semiconductor structure having a rectangular shape in a top view, the semiconductor structure comprising:
a first semiconductor layer including:
a first side parallel to an m-plane of the first semiconductor layer, and
a second side meeting the first side, the second side being parallel to an a-plane of the first semiconductor layer,
a light emitting layer disposed on a portion of the first semiconductor layer, and
a second semiconductor layer disposed on the light emitting layer;
a first conductive member disposed on the first semiconductor layer;
a second conductive member disposed on the second semiconductor layer;
a first terminal disposed on the first conductive member;
a second terminal disposed on the second conductive member; and
a covering member covering a lateral surface of the first conductive member, a lateral surface of the second conductive member, a lateral surface of the first terminal, and a lateral surface of the second terminal, wherein:
the first conductive member includes a first end surface facing the second conductive member,
the second conductive member includes a second end surface facing the first conductive member and being substantially parallel to the first end surface,
the first end surface and the second end surface are substantially formed of surfaces that are inclined with respect to the m-plane,
a portion of the first terminal and a portion of the second terminal are exposed from the covering member, and
an angle between a portion of the first end surface and the m-plane is in a range of 20 degrees to 40 degrees.

13. The light emitting device according to claim 12, wherein:
the first end surface includes a curved portion.

14. The light emitting device according to claim 12, wherein:
the first side is shorter than the second side, and
the exposed portion of the first terminal and the exposed portion of the second terminal are arranged along the second side.

15. The light emitting device according to claim 12, further comprising:
a wavelength conversion layer, wherein:
the wavelength conversion layer is in contact with the first semiconductor layer.

16. A light emitting device comprising:
a semiconductor structure having a rectangular shape in a top view, the semiconductor structure comprising:
a first semiconductor layer including:
a first side parallel to an m-plane of the first semiconductor layer, and
a second side meeting the first side, the second side being parallel to an a-plane of the first semiconductor layer,
a light emitting layer disposed on a portion of the first semiconductor layer, and
a second semiconductor layer disposed on the light emitting layer;
a first conductive member disposed on the first semiconductor layer;
a second conductive member disposed on the second semiconductor layer;

a first terminal disposed on the first conductive member;
a second terminal disposed on the second conductive member; and
a covering member covering a lateral surface of the first conductive member, a lateral surface of the second conductive member, a lateral surface of the first terminal, and a lateral surface of the second terminal, wherein:
the first conductive member includes a first end surface facing the second conductive member,
the second conductive member includes a second end surface facing the first conductive member and being substantially parallel to the first end surface,
the first end surface and the second end surface are substantially formed of surfaces that are inclined with respect to the m-plane,
a portion of the first terminal and a portion of the second terminal are exposed from the covering member, and
a shortest distance between the exposed portion of the first terminal and the exposed portion of the second terminal is greater than a shortest distance between the first end surface and the second end surface.

17. The light emitting device according to claim 16, wherein:
the first end surface includes a curved portion.

18. The light emitting device according to claim 16, wherein:
the first side is shorter than the second side, and
the exposed portion of the first terminal and the exposed portion of the second terminal are arranged along the second side.

19. The light emitting device according to claim 16, further comprising:
a wavelength conversion layer, wherein:
the wavelength conversion layer is in contact with the first semiconductor layer.

20. The light emitting device according to claim 1, wherein:
the first end surface and the second end surface are substantially formed of surfaces that are inclined with respect to the m-plane.

* * * * *